(12) United States Patent
Young et al.

(10) Patent No.: US 8,076,754 B2
(45) Date of Patent: Dec. 13, 2011

(54) SILICIDE-INTERFACE POLYSILICON RESISTOR

(75) Inventors: Steven G. Young, Austin, TX (US); David M. Szmyd, Austin, TX (US)

(73) Assignee: Silicon Laboratories, Austin, TX (US)

( * ) Notice: Subject to any disclaimer, the term of this patent is extended or adjusted under 35 U.S.C. 154(b) by 0 days.

(21) Appl. No.: 11/684,277

(22) Filed: Mar. 9, 2007

(65) Prior Publication Data
US 2008/0217741 A1    Sep. 11, 2008

(51) Int. Cl.
*H01L 29/8605* (2006.01)

(52) U.S. Cl. ......... 257/538; 257/E21.004; 257/E29.326; 438/384

(58) Field of Classification Search .......... 257/380, 257/536–538, E21.004, E27.047, E21.006; 438/238, 381–382, 384
See application file for complete search history.

(56) References Cited

U.S. PATENT DOCUMENTS

| | | | |
|---|---|---|---|
| 5,847,988 A * | 12/1998 | Babson et al. | 365/105 |
| 6,088,256 A * | 7/2000 | Worley et al. | 365/96 |
| 6,429,492 B1* | 8/2002 | Rockett | 257/368 |
| 6,580,156 B1* | 6/2003 | Ito et al. | 257/665 |
| 7,148,556 B2* | 12/2006 | Shaw et al. | 257/536 |
| 2006/0120143 A1* | 6/2006 | Liaw | 365/154 |
| 2007/0026579 A1* | 2/2007 | Nowak et al. | 438/149 |
| 2007/0099326 A1* | 5/2007 | Hsu et al. | 438/48 |

OTHER PUBLICATIONS

Quirk et al., "Characteristics of Semiconductor Materials," Semiconductor Manufacturing Technology, Prentice Hall, 2001, pp. 33-39.*

* cited by examiner

*Primary Examiner* — Mary Wilczewski
*Assistant Examiner* — Toniae Thomas
(74) *Attorney, Agent, or Firm* — Antony P. Ng; Yudell Isidore Ng Russell PLLC

(57) ABSTRACT

A silicide-interface polysilicon resistor is disclosed. The silicide-interface polysilicon resistor includes a substrate, an oxide layer located on top of the substrate, and a polysilicon layer located on top of the oxide layer. The polysilicon layer includes multiple semiconductor junctions. The silicide-interface polysilicon resistor also includes a layer of silicide sheets, and at least one of the silicon sheets is in contact with one of the semiconductor junctions located within the polysilicon layer.

10 Claims, 2 Drawing Sheets

SILICIDE-INTERFACE POLYSILICON RESISTOR

BACKGROUND OF THE INVENTION

1. Technical Field

The present invention relates to semiconductor manufacturing in general, and, in particular, to a method for manufacturing polysilicon resistors. Still more particularly, the present invention relates to a method for manufacturing silicide-interface polysilicon resistors.

2. Description of Related Art

Semiconductor device fabrication involves a variety of processes and operations. Such operations include, but are not limited to, layering, doping, heat treatments, and patterning. Layering is the operation used to add layers of a selected thickness to a wafer surface. The layers can be insulators, semiconductors, and/or conductors, which can be grown or deposited by a number of suitable methods such as chemical vapor deposition, sputtering, etc.

Doping is the process that introduces specific amounts of dopants in the wafer surface through openings in surface layers. Two general techniques of doping are thermal diffusion and ion implantation.

Heat treatments are operations in which a wafer is heated and cooled to achieve specific results. Generally, no additional material is added although contaminates and vapors may evaporate from the wafer surface. A common heat treatment is called an anneal that is typically employed to repair damage to crystal structures introduced by ion implantation.

Patterning is the operation that employs a series of steps that results in the removal of selected portions of added surface layers. The series of steps include forming a layer of resist or photoresist over a semiconductor device. Then, a resist mask or reticle is aligned with the semiconductor device. Subsequently, the layer of resist is exposed or irradiated through the resist mask, which selects portions of the layer of resist that are later removed to expose underlying portions of the semiconductor device. A fabrication process, such as ion implantation, ion diffusion, deposition, and/or etching, can then be performed on exposed portions of the semiconductor device.

Semiconductor devices typically include transistor and resistors. Many transistors have gate electrodes formed with polysilicon material. Similarly, many resistors are also formed with polysilicon material and are commonly referred to as polysilicon resistors or poly resistors.

Because of the continued demand in reducing the size of semiconductor devices, it is desirable to provide a highly resistive polysilicon resistor having a relatively small footprint.

SUMMARY OF THE INVENTION

In accordance with a preferred embodiment of the present invention, a silicide-interface polysilicon resistor includes a substrate, an oxide layer located on top of the substrate, and a polysilicon layer located on top of the oxide layer. The polysilicon layer includes multiple semiconductor junctions. The silicide-interface polysilicon resistor also includes a layer of silicide sheets, and at least one of the silicon sheets is in contact with one of the semiconductor junctions located within the polysilicon layer.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
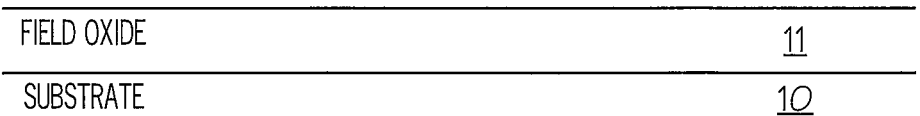
FIGS. 1a-1e are high-level process flow diagrams of a method for manufacturing a silicide-interface polysilicon resistor, in accordance with a preferred embodiment of the present invention.
Figure 1B:
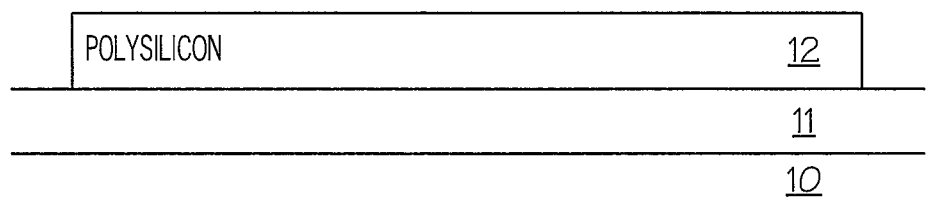
Figure 1C:
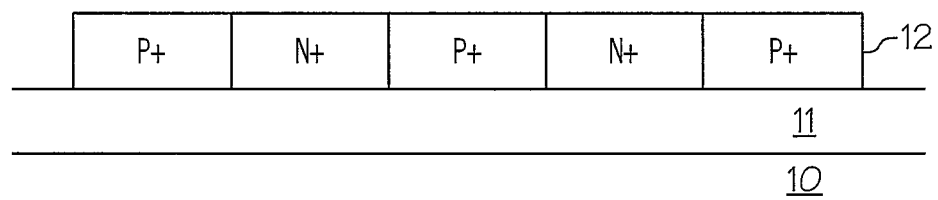

Referring now to the drawings and in particular to FIGS. 1a-1e, there are depicted multiple high-level process flow diagrams of a method for manufacturing a silicide-interface polysilicon resistor, in accordance with a preferred embodiment of the present invention. Initially, a field oxide layer 11 is deposited on top of a substrate 10, as shown in FIG. 1a. The thickness of field oxide layer 11 is preferably 0.4 μm.

Next, a polysilicon layer 12 is deposited on top of field oxide layer 11. Polysilicon layer 12 is then patterned to the shape and size of a desired polysilicon resistor, as deposited in FIG. 1b. The thickness of polysilicon layer 12 is preferably 0.2 μm.

Polysilicon layer 12 is subsequently implanted with $N^+$ dopants and $P^+$ dopants in an alternate (or interleaving) fashion, as shown in FIG. 11c. For example, $N^+$ dopants can be arsenic or phosphorus, and $P^+$ dopants can be boron. Although the $N^+$ doped regions and the $P^+$ doped regions are shown to be directly contacted with each other, it is understood by those skilled in the art that a small gap can be formed between an $N^+$ doped region and a $P^+$ doped region.

Figure 1D:
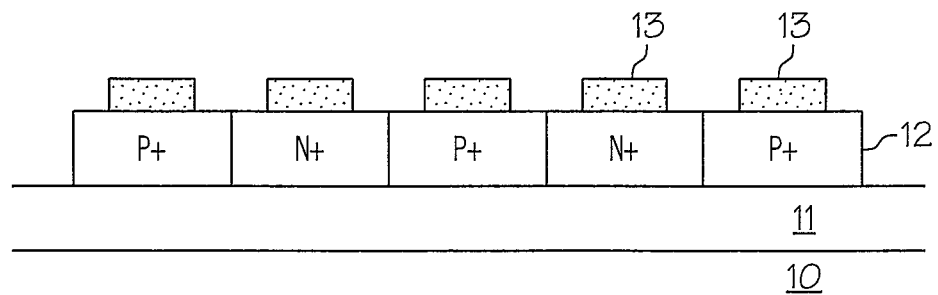

An isolation layer is deposited on top of polysilicon layer 12 having $N^+$ and $P^+$ doped regions. Having a preferable thickness of 0.02 μm, the isolation layer can be made of silicon oxide or silicon nitride. The isolation layer is then etched according to a desired pattern to yield multiple silicide blocks 13, which leaves all PN junctions in polysilicon layer 12 exposed, as depicted in FIG. 1d. The purpose of silicide blocks 13 is to serve as a barrier such that silicide will not be formed on the areas under silicide blocks 13.

A refractory metal layer is then deposited on top of silicide blocks 13 as well as on top of the exposed PN junctions within polysilicon layer 12. Refractory metal layer can be, for example, titanium, cobalt, nickel, platinum, etc. Heat is subsequently applied to transform refractory metal layer into silicide sheets at the exposed portions of polysilicon layer 12. The portions on which the refractory metal layer situated on top of silicide blocks 13 remains to be a metal layer.

Figure 1E:
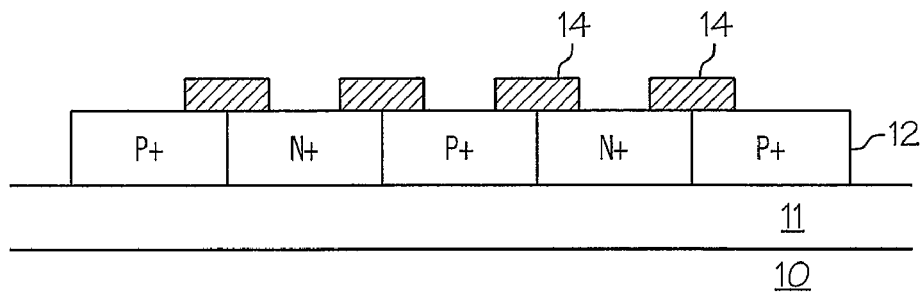

All portions of the refractory metal layer situated on top of insulator layer 13 are then stripped off from polysilicon layer 12 to form a silicide-interface polysilicon resistor having silicide sheets 14 at various exposed portions of polysilicon layer 12, as shown in FIG. 1e.

A redistribution of dopant atoms in polysilicon layer 12 occurs during the transformation of the metal to silicide sheets 14, which may result in an impurity depletion zone located underneath the contact interface between silicide sheets 14 and polysilicon layer 12. While silicide sheets 14 have a relatively low resistance in general, the impurity depletion zone can have a very high resistance. Such resistive property can be exploited by forcing current to repeatedly traverse the silicide interface, as described below.

Figure 2A:
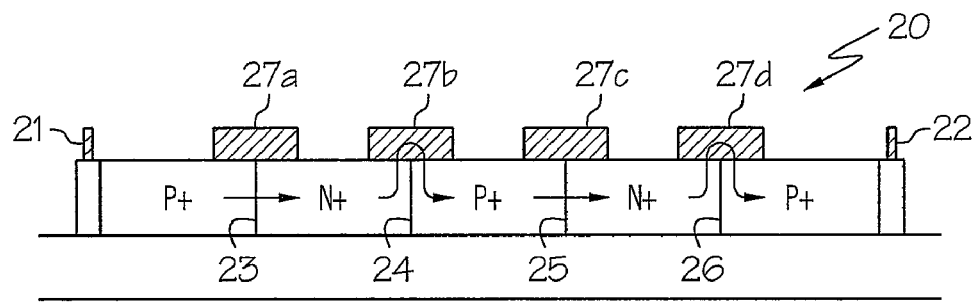
FIGS. 2a-2b depict the current flow within a silicide-interface polysilicon resistor, in accordance with a preferred embodiment of the present invention.

With reference now to FIG. 2a, there is depicted the current flow within a silicide-interface polysilicon resistor, in accordance with a preferred embodiment of the present invention. As shown, a silicide-interface polysilicon resistor 20 includes multiple N+ and P+ doped regions that yield PN junctions 23-26 at respective locations where an N+ doped region meets a P+ doped region. In addition, PN junction 23 is in contact with a silicide sheet 27a, PN junction 24 is in contact with a silicide sheet 27b, PN junction 25 is in contact with a silicide sheet 27c, and PN junction 26 is in contact with a silicide sheet 27d.

Silicide-interface polysilicon resistor 20 also includes a contact 21 and a contact 22. When current is flowing from contact 21 to contact 22, PN junctions 23 and 25 provide forward-bias to the current while PN junctions 24 and 26 provide reverse-bias to the current. Thus, the current is forced to flow through silicide sheet 27b at PN junction 24 because silicide sheet 27b has less resistance than the adjacent PN junction. Similarly, the current is forced to flow through silicide sheet 27d at PN junction 26.

Figure 2B:
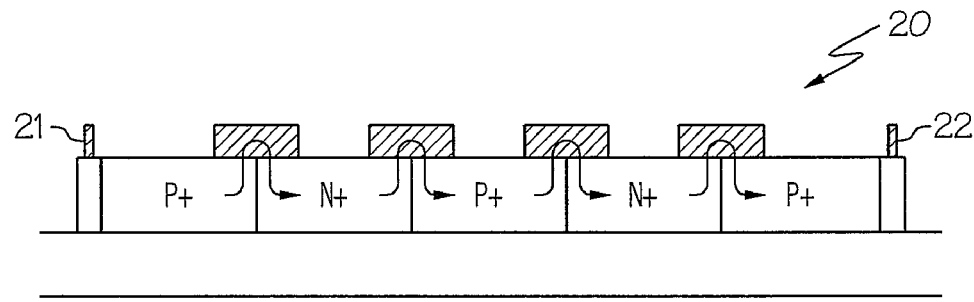

However, when the voltage between contact 21 and contact 22 is not high enough to turn on the PN junctions 23 and 25, then all PN junctions 23-26 are off, blocking the current flowing from contact 21 to contact 22. Thus, the current is forced to flow through silicide sheet 27a at PN junction 23, silicide sheet 27b at PN junction 24, silicide sheet 27c at PN junction 25, silicide sheet 27d at PN junction 26, as shown in FIG. 2b. As a result, at low current levels, the resistance of silicide-interface polysilicon resistor 20 becomes higher.

Because many PN junctions, such as PN junctions 23-26, can be placed closely together between contacts 21 and 22, and the interface resistance of the corresponding silicide sheets associated with the PN junctions, such as silicide sheets 27a-27d, can be quite high, a very high resistance silicide-interface polysilicon resistor can be achieved in a relatively small physical area.

Figure 3:
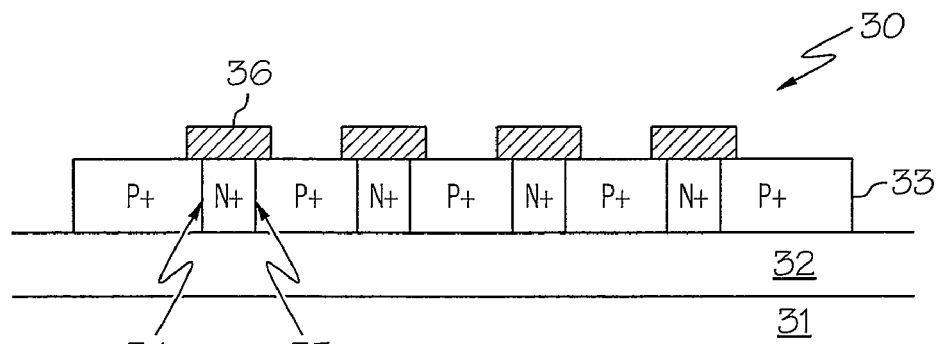
FIG. 3 is a silicide-interface polysilicon resistor, in accordance with an alternative embodiment of the present invention.

Referring now to FIG. 3, there is depicted a silicide-interface polysilicon resistor, in accordance with an alternative embodiment of the present invention. As shown, a silicide-interface polysilicon resistor 30 includes a substrate 31, a field oxide layer 32, a polysilicon layer 33 having alternate N+ and P+ doped regions. But instead of having one PN junction being contacted by one silicide sheet, two PN junctions are being contacted by one silicide sheet. For example, two PN junctions 34-35 being contacted by one silicide sheet 36. Regardless of the direction of current flow (either from left to right or from right to left in FIG. 3), current will enter an N+ doped region located between two P+ doped regions. Thus, current will encounter one PN junction that is forward-biased and another PN junction that is reverse-biased. When confronting a reverse-biased PN junction, current will travel through one of the adjacent silicide sheets, such as silicide sheet 36 for PN junctions 34-35, similarly to those shown in FIGS. 2a-2b. Basically, each silicide sheet in silicide-interface polysilicon resistor 30 is capable of handling current flowing in both directions. The advantage of this alternative embodiment over the preferred embodiment shown in FIGS. 2a-2b is that a higher resistance can be maintained at high current levels because current is forced through every high-resistance silicide interface within silicide-interface polysilicon resistor 30.

As has been described, the present invention provides a method for manufacturing silicide-interface polysilicon resistors. Although PN junctions are utilized the principle of the invention, it is understood by those skilled in the art that the present invention is also applicable to semiconductor junctions having an intrinsic regions such as PIN junctions, PIP junctions, or NIN junctions.

While the invention has been particularly shown and described with reference to a preferred embodiment, it will be understood by those skilled in the art that various changes in form and detail may be made therein without departing from the spirit and scope of the invention.

What is claimed is:

1. A resistor comprising:
    a substrate;
    an oxide layer located on top of said substrate;
    a polysilicon layer located on top of said oxide layer, wherein said polysilicon layer includes a plurality of semiconductor junctions;
    and a plurality of silicide sheets located on top of said polysilicon layer, wherein at least one of said silicide sheets straddles across two of said semiconductor junctions within said polysilicon layer.

2. The resistor of claim 1, wherein said two of said semiconductor junctions are formed by one N+ doped region and two P+ doped regions within said polysilicon layer.

3. The resistor of claim 2, wherein said N+ doped region is formed by arsenic or phosphorus.

4. The resistor of claim 2, wherein said P+ doped region is formed by boron.

5. The resistor of claim 1, wherein said silicide sheets are formed by any of titanium, cobalt, nickel or platinum.

6. The resistor of claim 1, wherein said two of said semiconductor junctions are PN junctions, PIN junctions, PIP junctions, or NIN junctions.

7. A method for manufacturing a resistor, said method comprising:
    depositing an oxide layer on top of a substrate;
    depositing a polysilicon layer on top of said oxide layer, wherein said polysilicon layer includes a plurality of semiconductor junctions, wherein one of said semiconductor junctions is formed by one N+ doped region and one P+ doped region; and
    forming a silicide sheet that straddles across two of said semiconductor junctions located within said polysilicon layer.

8. The method of claim 7, wherein said N+ doped region is formed by arsenic or phosphorus.

9. The method of claim 7, wherein said P+ doped region is formed by boron.

10. The method of claim 7, wherein said silicide sheet is formed by any of titanium, cobalt, nickel or platinum.

* * * * *